United States Patent
Do

(10) Patent No.: US 7,414,898 B2
(45) Date of Patent: Aug. 19, 2008

(54) SEMICONDUCTOR MEMORY DEVICE WITH INTERNAL POWER SUPPLY

(75) Inventor: Chang-Ho Do, Ichon-shi (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 27 days.

(21) Appl. No.: 11/139,608

(22) Filed: May 31, 2005

(65) Prior Publication Data
US 2006/0092745 A1    May 4, 2006

(30) Foreign Application Priority Data
Nov. 4, 2004 (KR) .................. 10-2004-0089322

(51) Int. Cl.
*G11C 7/00*    (2006.01)

(52) U.S. Cl. ............. 365/191; 365/189.07; 365/230.06; 365/194; 365/229

(58) Field of Classification Search ........... 365/191, 365/189.07, 230.06
See application file for complete search history.

(56) References Cited

U.S. PATENT DOCUMENTS

| | | | | |
|---|---|---|---|---|
| 4,581,722 A | * | 4/1986 | Takemae | 365/230.06 |
| 6,166,990 A | * | 12/2000 | Ooishi et al. | 365/233 |
| 7,023,754 B2 | * | 4/2006 | Akiyama et al. | 365/226 |

* cited by examiner

*Primary Examiner*—Hoai V. Ho
*Assistant Examiner*—Kretelia Graham
(74) *Attorney, Agent, or Firm*—McDermott Will & Emery LLP

(57) ABSTRACT

Provided is a semiconductor memory device including an internal power supply with low current consumption, which includes: an active interval security block for generating active interval security signals with operation intervals by a row active signal and a column active signal; an active driving signal generating block for generating an active driving signal, responsive to the active interval security signals; a standby driving block for holding the level of an internal voltage; and an active driving block, which is additionally driven based on the active driving signal to hold the internal voltage.

17 Claims, 5 Drawing Sheets

SEMICONDUCTOR MEMORY DEVICE WITH INTERNAL POWER SUPPLY

FIELD OF INVENTION

The present invention relates to a semiconductor design technique; and, more particularly, to a semiconductor memory device including an internal power supply with low current consumption.

DESCRIPTION OF PRIOR ART

With ever-increasing use of semiconductor memory devices, in mobile products based on careful study of the low-power consumption, the consumption current of the semiconductor memory devices came into a key component that is most critical in determining the overall performance thereof.

For this reason, the semiconductor memory device uses a standby driver with a small driving force, since the amount of required current is small at a standby mode awaiting the input of an external command without a substantive operation; and it additionally drives an active driver to provide amount of the current, at an active mode that requires a large amount of the current due to the execution of the operation based on the input of the external command.

Specifically, at the standby mode, the small current consumption needs not a quick response time, allowing the standby driver with the small driving force to be used; and at the active mode, the large current consumption requires a quick response time, allowing the active driver with a lager driving force to be used.

FIG. 1 illustrates a circuit diagram of a conventional internal power supply of a semiconductor memory device.

Referring to FIG. 1, the conventional internal power supply includes a standby driving block 10 for holding an internal voltage VINT at a standby mode; an active driving block 20 for holding the internal voltage VINT, responsive to a large amount of the power consumption taking place at the active mode; and an active driving controlling block 30 for allowing the active driving block 20 to be additionally driven at the active mode.

The standby driving block 10 including a level sensing block 12, responsive to a bias signal Vbias, for sensing a difference between a level of the internal voltage VINT and that of a reference voltage VREF; and a driver PM1 for providing the internal voltage VINT under the control of the level sensing block 12.

The active driving block 20 includes a level sensing block 22, responsive to an active driving signal acten provided thereto from the active driving controlling block 30, for sensing a difference between a level of the internal voltage VINT and that of a reference voltage VREF; and a driver PM2 for providing the internal voltage VINT under the control of the level sensing block 22.

For the purpose of reference, both of the standby driving block 10 and the active driving block 20 are a voltage down converter that down-converts the level of the external voltage to provide the same as the internal voltage VINT.

FIG. 2 illustrates an operation waveform diagram of FIG. 1 relating to a core access operation of the semiconductor memory device. A detailed description of the operation of the internal power supply will be given with reference to FIG. 2.

First, the bias signal Vbias is constantly activated 10 after power-up. Thus, the level sensing block 12 in the standby driving block 10 continually senses the difference between the level of the internal voltage VINT and that of the reference voltage VREF to drive the driver PM1, allowing the level of the internal voltage VINT to be stably held at the standby mode.

One the one side, the active driving controlling block 30 activates the active driving signal acten responsive to the application of the active command ACT, the level sensing block 22 in the active driving block 20 senses the difference between the level of the internal voltage VINT and that of the reference voltage VREF to drive the driver PM2, providing the internal voltage VINT, responsive to the active driving signal acten.

Thereafter, the active driving controlling block 30 non-activates the active driving signal acten responsive to the application of the pre-charge command PRG, allowing the active driving block 20 to be turned off.

As stated above, the conventional internal power supply of the semiconductor memory device of prior art senses the active mode based on the active command ACT and the pre-charge command PRG, and continually drives an active driving block with a large driving force during the active mode. Therefore, the level sensing block in the active driving block continues to operate even when there is no a substantive operation due to none of the command input after the entry to the active mode, causing unnecessary current consumption.

For the purpose of reference, holding the active mode without the application of a new command after the entry to the active mode is referred to as an active standby state a current that is consumed at that moment is referred to as IDD3N.

SUMMARY OF INVENTION

It is, therefore, a primary object of the present invention to provide a semiconductor memory device including an internal power supply with low current consumption.

In accordance with a preferred embodiment of the present invention, there is provided a semiconductor memory device including: an active interval security means for generating active interval security signals with operation intervals by a row active signal and a column active signal; an active driving signal generating means for generating an active driving signal, responsive to the active interval security signals; a standby driving means for holding the level of an internal voltage; and an active driving means, which is additionally driven based on the active driving signal to hold the internal voltage.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF INVENTION

Hereinafter, a semiconductor memory device including an internal power supply in accordance with the present invention will be described in detail referring to the accompanying drawings.

Figure 1:
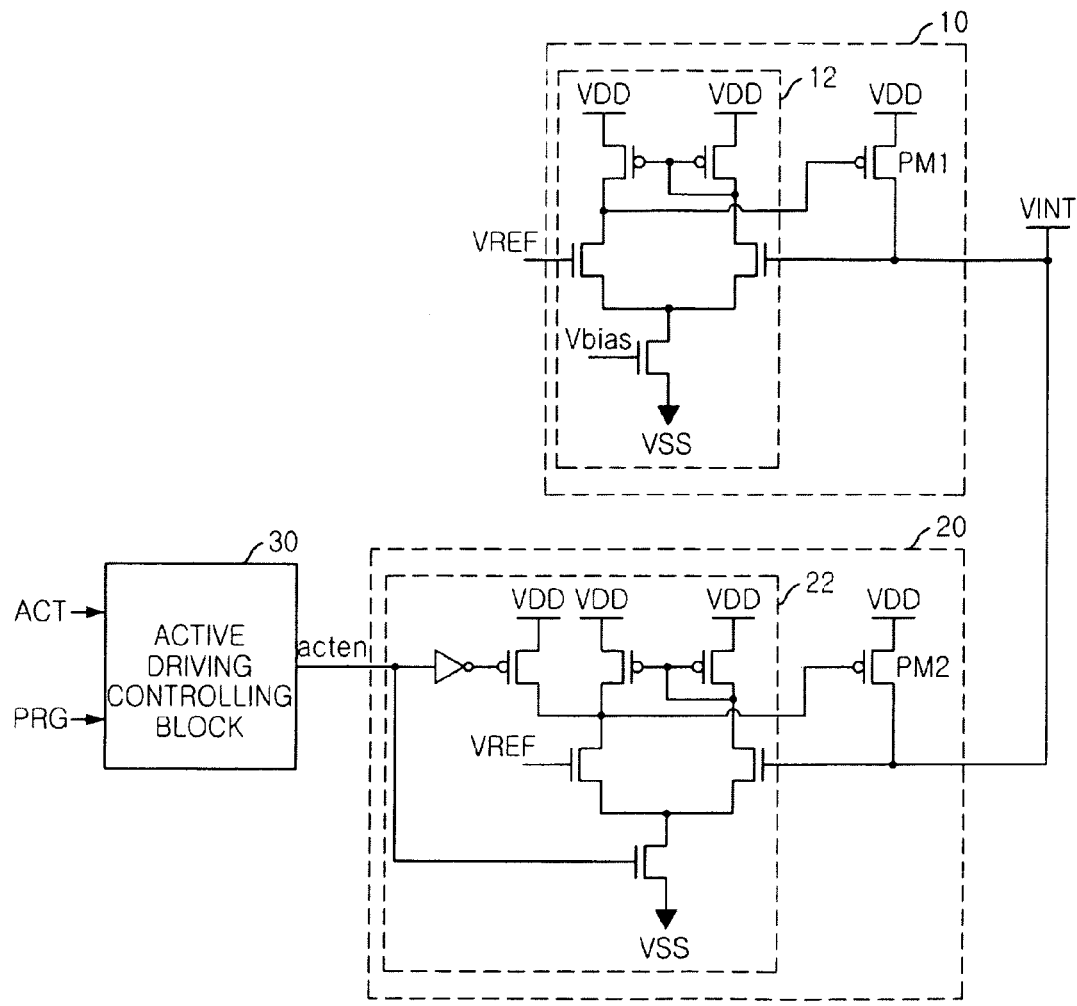
FIG. 1 illustrates a circuit diagram of a conventional internal power supply of a semiconductor memory device.
Figure 2:
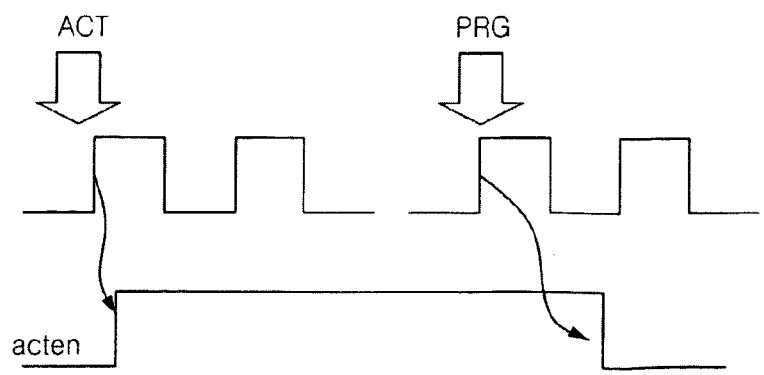
FIG. 2 illustrates an operation waveform diagram of FIG. 1 relating to a core access operation of the semiconductor memory device.
Figure 3:
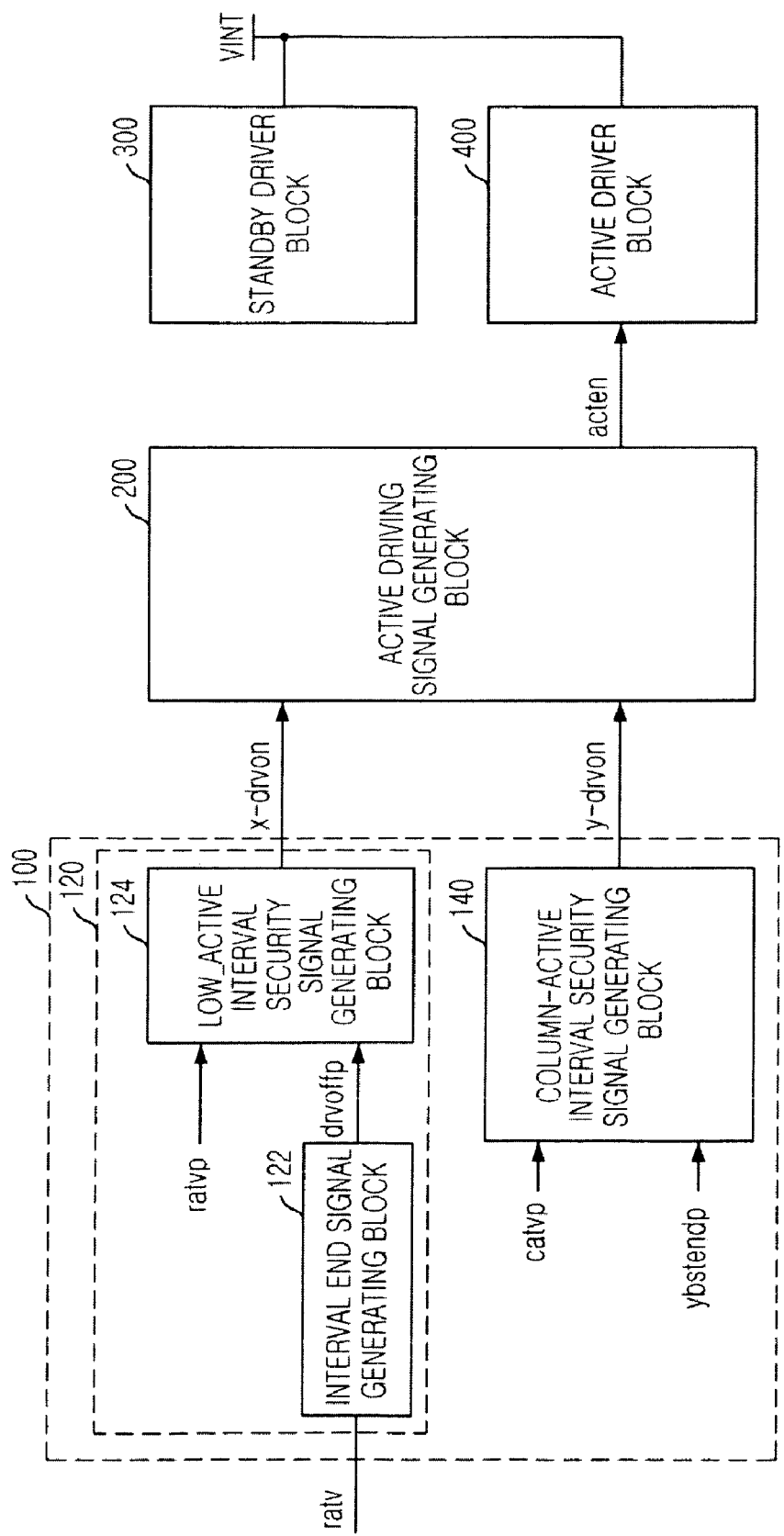
FIG. 3 is a block diagram of an internal power supply of a semiconductor memory device in accordance with a preferred embodiment of the present invention.

FIG. 3 is a block diagram of an internal power supply of a semiconductor memory device in accordance with a preferred embodiment of the present invention.

As shown in FIG. 3, the internal power supply of the semiconductor memory device in accordance with the preferred embodiment of the present invention comprises: an active interval security block 100 for generating active interval 20 security signals x-drvon and y-drvon with operation intervals by a row active signal ratv and a column active signal catvp; an active driving signal generating block 200 for generating an active driving signal acten, responsive to the active interval security signals x-drvon and y-drvon; a standby driving block 300 for holding the internal voltage VINT; and an active driving block 400, which is additionally driven based on the active driving signal acten to hold the internal voltage VINT.

The active interval security block 100 includes a row-active interval sensing block 120 for sensing a row-active interval; and a column-active interval security signal generating block 140 for generating the column-active interval security signal y-drvon with a column-active interval by the column active signal catvp.

The row-active interval sensing block 120 includes an interval end signal generating block 122 for generating an 10 interval end signal drvoffp which represents end of the row-active interval; and a row-active interval security signal generating block 124, responsive to the row-active signal ratvp and the interval end signal drvoffp, for generating the row-active interval security signal x-drvon with the row-active interval.

As stated above, the internal power supply of the semiconductor memory device of the present invention detects the application of the row-active signal ratv and the column-active signal catvp through the use of the active interval security block 100, and further drives the active driving block 400 only while the device operates responsive to the application of the row-active signal ratv and the column-active signal catvp.

Therefore, in the active standby state with no application of a new command at the active mode, the active driving block 400 is not driven, thereby preventing unnecessary current consumption from being caused.

In the following, the active interval security block 100 and the active driving signal generating block 200 are described in more detail.

Figure 4:
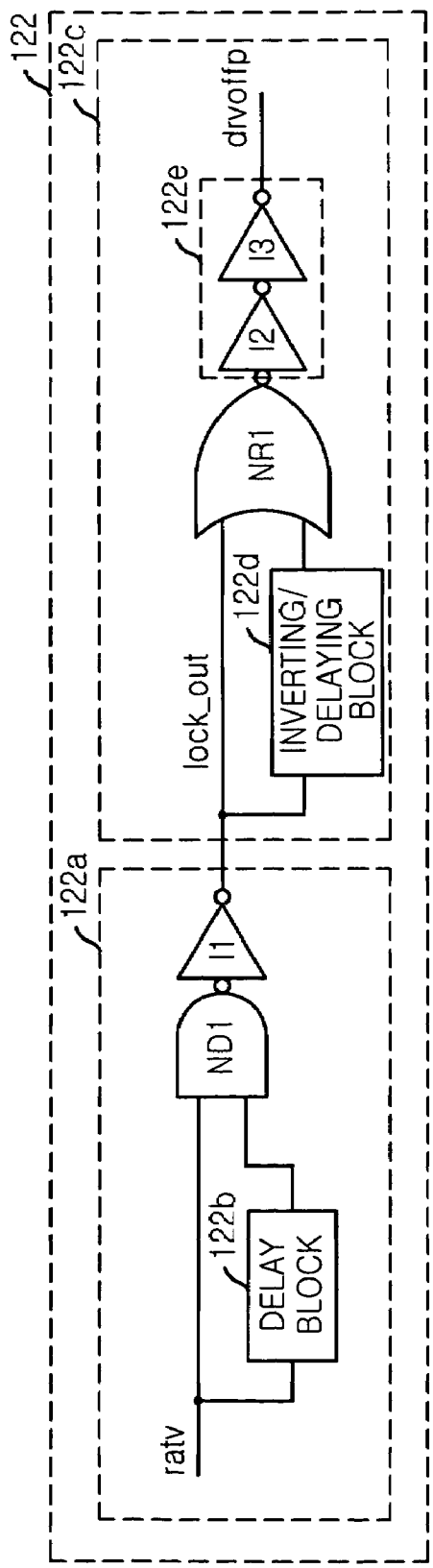
FIG. 4 illustrates a detailed internal circuit diagram of the interval end signal generating block 122 shown in FIG. 3.

FIG. 4 illustrates a detailed internal circuit diagram of the interval end signal generating block 122 shown in FIG. 3.

Referring to FIG. 4, the interval end signal generating block 122 includes a row-active interval signal generating block 122a for activating a row-active interval signal lock-out responsive to the activation of the row-active signal ratv, and holding the activation of the row-active interval signal lock-out during the operation time of the device based on the row-active signal ratv; and a edge sensing block 122c for sensing the transition of the row-active interval signal lock-out to generate the interval end signal drvoffp.

Specifically, the row-active interval signal generating block 122a includes a delay block 122b for delaying the row-active signal ratv during the operation time of the device based on the row-active signal ratv, and outputting the same; a NAND gate ND1 having the row-active signal ratv and the output signal of the delay block 122b as its inputs; and an inverter I1 for inverting the output signal of the NAND gate ND1 and outputting the same as the row-active interval signal lock-out.

The edge sensing block 122c includes an inverting/delaying block 122d for inverting/delaying the row-active interval signal lock-out; a NOR gate NR1 having the row-active interval signal lock-out and the output signal of the inverting/delaying block 122d as its inputs; and an inverter chain 122e with two serial-connected inverters I2 and I3, for delaying the output signal of the NOR gate NR1 and outputting the same as the interval end signal drvoffp.

For the purpose of reference, the delay block 122b may be implemented by a plurality of an inverter, a resistance, and a capacitor. And, the inverting/delaying block 122d may be implemented by odd-number of inverter(s), a resistance, and a capacitor.

Figure 5:
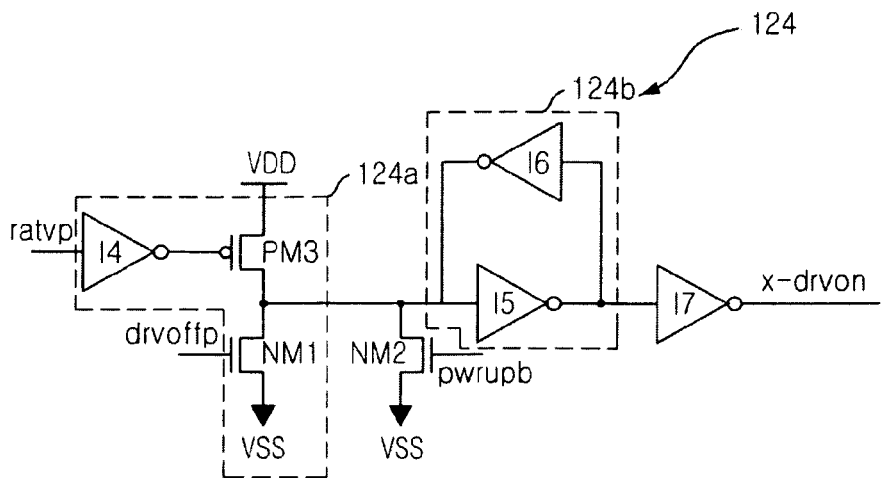
FIG. 5 is a detailed internal circuit diagram of the row-active interval security signal generating block 124 shown in FIG. 3.

FIG. 5 is a detailed internal circuit diagram of the row-active interval security signal generating block 124 shown in FIG. 3.

Referring to FIG. 5, the row-active interval security signal generating block 124 includes an input block 124a for activating its output signal responsive to the row-active signal ratvp, and non-activating its output signal responsive to the interval end signal drvoffp; an initialization block NM2 for initializing the output node of the input block 124a responsive to the power-up signal pwrupb; a latch block 124b for latching the output signal of the input block 124a; and an inverter I7 for inverting the output signal of the latch 124b and outputting the same as the row-active interval security signal x-drvon.

The input block 124a includes an inverter I4 for inverting the row-active signal ratvp; a PMOS transistor PM3 which has the output signal of the inverter I4 as its gate input, and a source-drain path at between the power supply voltage VDD and its output node; and an NMOS transistor NM1 which has the interval end signal drvoffp as its gate input, and a drain-source path at between its output node and the power supply voltage VSS.

The initialization block NM2 includes an NMOS transistor which has the power-up signal pwrupb as its gate input, and a drain-source path at between its output node and the power supply voltage VSS. The latch block 124b includes first and second inverters I5 and I6 which are cross-coupled.

Referring to FIGS. 4 and 5, the row-active interval sensing block 120 allows the operation interval of the device based on the row-active signal ratv to be contained in an activated region of the row-active interval security signal x-drvon. Thus, the active driving block 400 which is additionally driven, provides the current to be consumed by the operation of the device based on the application of the row-active signal ratv.

To accomplish this, the row-active interval signal generating block 122a allows the delay block 122b to delay the row-active signal ratv and to output the same as the row-active interval signal lock-out, wherein the delay block 122b has a delay amount corresponding to the operation time of the device based on the row-active signal ratv, thereby informing the operation interval of the device based on the row-active signal ratv. And, the edge sensing block 122c activates the interval end signal drvoffp at a time which the row-active interval signal lock-out is non-activated, thereby informing the end time of the interval.

Therefore, the operation interval of the device based on the row-active signal ratv is contained within the activated region of the row-active interval security signal x-drvon, which is activated responsive to the activation of the row-active signal ratvp and is non-activated responsive to the interval end signal drvoffp, at the row-active interval security signal generating block 124.

For the purpose of reference, when the row-active signal ratv is applied to the semiconductor memory device, several thousands of memory cell data connected to corresponding wordlines are simultaneously sensed and amplified by a bit-line sense amplifier. This operation means the aforementioned operation of the device based on the row-active signal ratv. At this time, a considerable amount of current consumption is caused.

Figure 6:
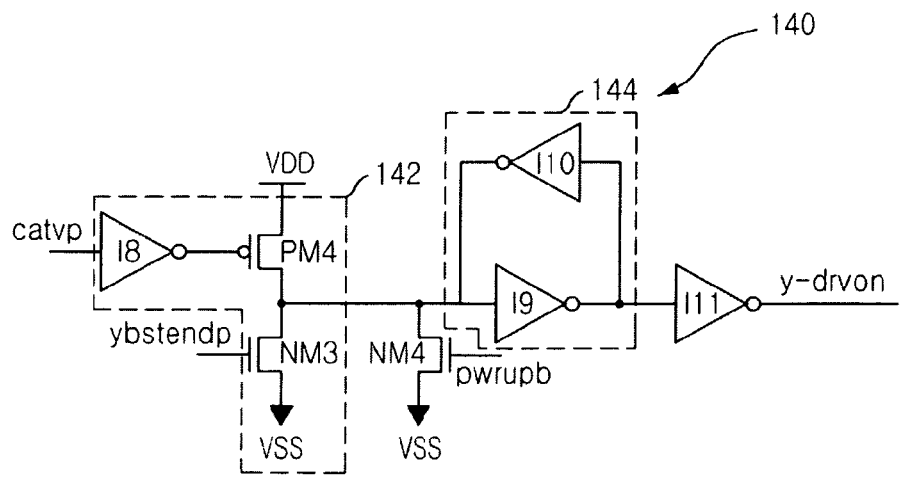
FIG. 6 is a detailed internal circuit diagram of the column-active interval security signal generating block 140.

FIG. 6 is a detailed internal circuit diagram of the column-active interval security signal generating block 140.

Referring to FIG. 6, the column-active interval security signal generating block 140 includes an input block 142 for activating its output signal responsive to the column-active signal catvp, and non-activating its output signal responsive to a burst end signal ybstendp; an initialization block NM4 for initializing the output node of the input block 142 responsive to the power-up signal pwrupb; a latch block 144 for latching the output signal of the input block 142; and an inverter I11 for inverting the output signal of the latch block 144 and outputting the same as the column-active interval security signal y-drvon.

The input block 142 includes an inverter I8 for inverting the column-active signal catvp; a PMOS transistor PM4 which has the output signal of the inverter I8 as its gate input, and a source-drain path at between the power supply voltage VDD and its output node; and an NMOS transistor NM3 which has the burst end signal ybstendp as its gate input, and a drain-source path at between its output node and a power supply voltage VSS.

The initialization block NM4 includes an NMOS transistor which has the power-up signal pwrupb as its gate input, and a drain-source path at between its output node and the power supply voltage VSS. The latch block 144 includes first and second inverters I9 and I10 which are cross-coupled.

For the purpose of reference, the burst end signal ybstendp is that informs the end of burst operation, and the burst operation represents that the read/write operation, which being column access operation, is performed only one time or continuously performed.

Figure 7:
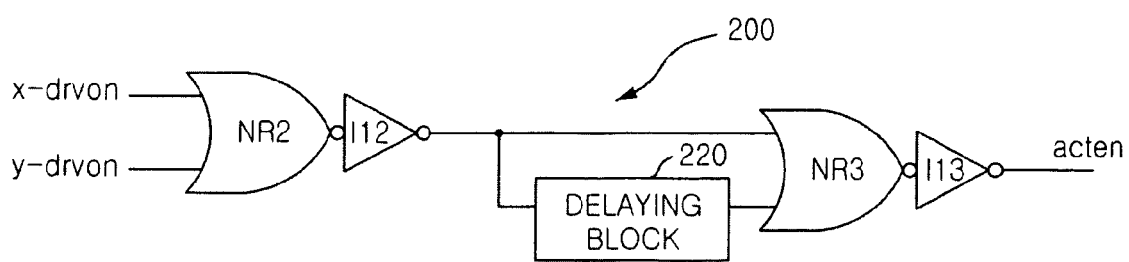
FIG. 7 is a detailed internal circuit diagram of the active driving signal generating block 200.

FIG. 7 is a detailed internal circuit diagram of the active driving signal generating block 200.

Referring to FIG. 7, the active driving signal generating block 200 includes a NOR gate NR2 having the row-active interval security signal x-drvon and the column-active interval security signal y-drvon as its inputs; an inverter I12 for inverting the output signal of the NOR gate NR2; a delay block 220 for delaying the output signal of the inverter I12 by a predetermined time; a NOR gate NR3 having the output signals of the inverter I12 and the delay block 220 as its inputs; and an inverter I13 for inverting the output signal of the NOR gate NR3 and outputting the same as the active driving signal acten.

In operation, the active driving signal generating block 200 activates the active driving signal acten during the activation of the row-active interval security signal x-drvon or the column-active interval security signal y-drvon.

Further, the active driving signal generating block 200, in the non-activation of the row-active interval security signal x-drvon or the column-active interval security signal y-drvon, activates the active driving signal acten at the same time; and non-activates it after a delay time of the delay block 220, thereby ensuring a margin.

Figure 8:
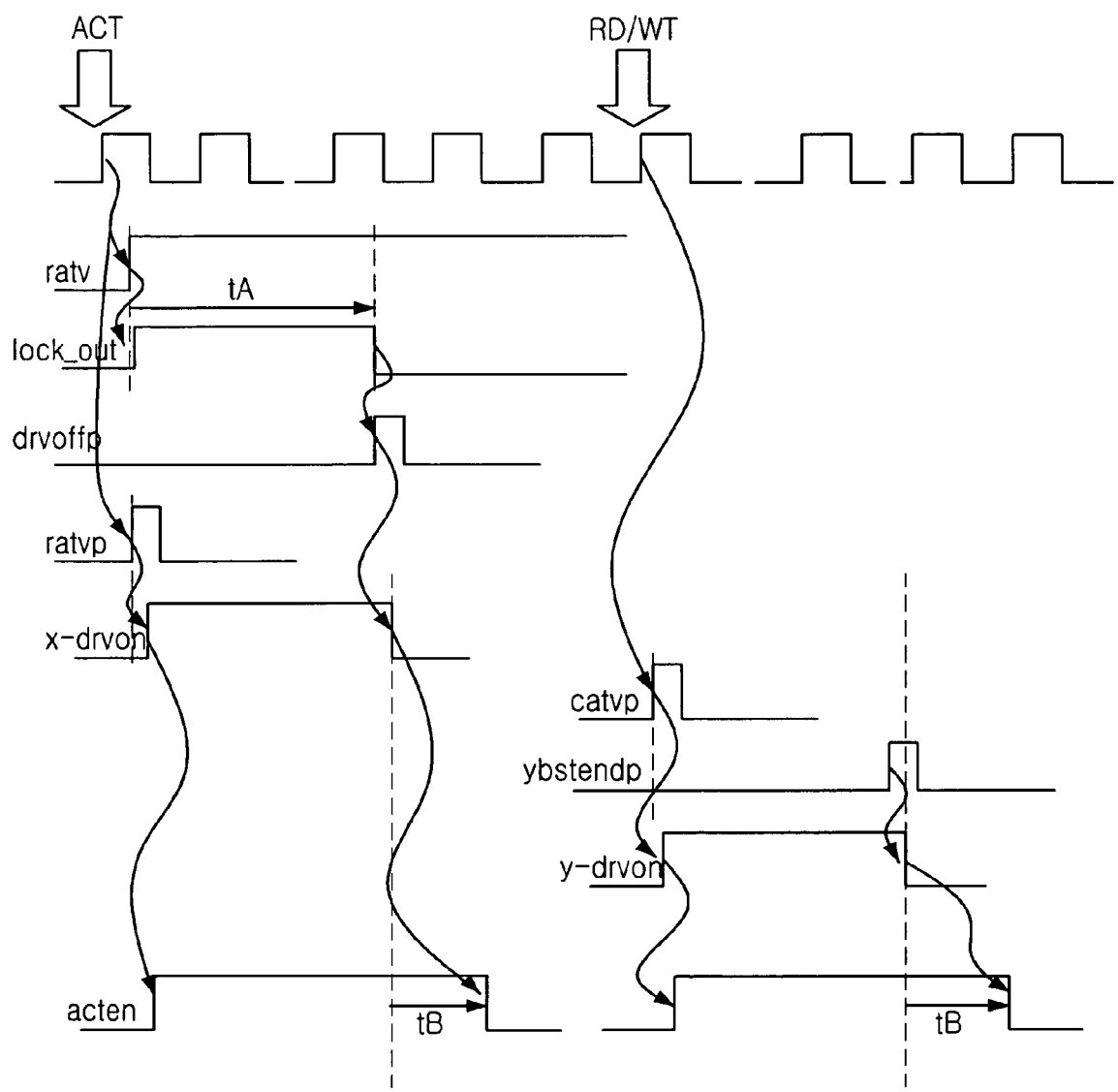
FIG. 8 is an operation waveform diagram of FIG. 3 according to a core access operation of the semiconductor memory device.

FIG. 8 is an operation waveform diagram of FIG. 3 according to a core access operation of the semiconductor memory device. A detailed description will be as to the operation of the internal power supply in accordance with the preferred embodiment of the present invention with reference to FIG. 8.

First, the application of the active command ACT activates the row-active signal ratv.

The row-active interval signal generating block 122a activates the row-active interval signal lock-out responsive to the activation of the row-active signal ratv, wherein the activation by the row-active interval signal generating block 122a is hold during the time corresponding to the operation time of the device based on the row-active signal ratv. The delay block 122b detects the falling edge of the row-active interval signal lock-out and activates the interval end signal drvoffp.

Further, the row-active interval security signal generating block 124 activates the row-active interval security signal x-drvon responsive to the activation of the row-active signal ratvp, and non-activates the row-active interval security signal x-drvon responsive to the interval end signal drvoffp.

Thereafter, the active driving signal generating block 200 activates the active driving signal acten during the activation of the row-active interval security signal x-drvon, allowing the active driving block 400 to be additionally driven.

As is described above, the activation of the active driving signal acten is accomplished through the row-active interval security signal x-drvon containing the operation interval tA of the device based on the row-active signal ratv, and then the active driving block 400 is driven. And then, the active driving block 400 provides the current to be consumed by the row-active signal acten, thereby making it possible to stably hold the interval voltage VINT.

On the one side, the application of the write command WT or the read command RD after the active command ACT activates the column-active signal catvp, and then the column-active interval security signal generating block 140 activates the column-active interval security signal y-drvon and holds the activation up until the activation of the burst end signal ybstendp ago.

Thereafter, the active driving signal generating block 200 activates the active driving signal acten during the activation of the column-active interval security signal y-drvon, thereby allowing the active driving block 400 to be driven.

As is described above, even when the column-active signal catvp is applied, the column-active interval security signal y-drvon containing the operation time of the device generated by the column-active signal catvp is crated, allowing the active driving signal acten to be activated. Thus, the active driving block 400 additionally driven provides the current to be consumed by the operation of the device based on the column-active signal catvp.

For the purpose of reference, when the read command RD or the write command WT are applied, the semiconductor memory device activates the column-active signal catvp as an internal signal for processing the commands RD or WT.

Further, the margin tB, which being set from the non-activation of the row-active interval security signal x-drvon or the column-active interval security signal y-drvon to the non-activation of the active driving signal acten, is obtained through the use of the delay block 220 in the active driving signal generating block 200. As stated above, the ensuring of the margin tB prevents the active driving signal acten from being necessarily toggled, in case the row-active interval security signal x-drvon or the column-active interval security signal y-drvon are again applied.

As demonstrated above, the semiconductor memory device with the internal power supply in accordance with the preferred embodiment of the present invention detects the application of the external command and additionally drives an active driving block only at the interval that a large amount of power supply consumption is generated. Therefore, the semiconductor memory device of the present invention reduces a necessary current consumption resulting from an active standby state in the prior art, thereby eliminating the amount of current consumption.

The present application contains subject matter related to Korean patent application No. 2004-89322, filed in the Korean Patent Office on Nov. 4, 2004, the entire contents of which being incorporated herein by reference.

While the present invention has been described and illustrated with respect to a preferred embodiment of the invention, it will be apparent to those skilled in the art that variations and modifications are possible without deviating from the broad principles and teachings of the present invention which should be limited solely by the scope of the claims appended hereto.

What is claimed is:

1. A semiconductor memory device comprises:
    an active interval security means for generating security signals activated during a first predetermined operation period corresponding to a row active signal and a second predetermined operation period corresponding to a column active signal;
    an active driving signal generating means for generating an active driving signal, responsive to the security signals;
    a standby driving means for keeping an internal voltage to a predetermined level; and
    an active driving means, which is additionally driven based on the active driving signal to hold the internal voltage,
    wherein the active interval security means includes:
    a row-active interval sensing means for sensing the first predetermined operation period corresponding to the row active signal; and
    a column-active interval security signal generating means for sensing the second predetermined operation period corresponding to the column active signal,
    wherein the row-active interval sensing means includes:
        an interval end signal generating means for generating an interval end signal which represents end of the first predetermined operation period; and
        a row-active interval security signal generating means, responsive to the row-active signal and the interval end signal, for generating a row-active interval security signal activated during first predetermined operation period,
    wherein the security signals includes the row-active interval security signal.

2. The semiconductor memory device of claim 1, wherein the interval end signal generating means includes:
    a row-active interval signal generating means for activating a row-active interval signal responsive to the activation of the row-active signal, and holding the activation of the row-active interval signal during the first predetermined operation period based on the row-active signal; and
    an edge sensing means for sensing the transition of the row-active interval signal to generate the interval end signal.

3. The semiconductor memory device of claim 2, wherein the row-active interval signal generating means includes:
    a first delay means for delaying the row-active signal during the first predetermined operation period based on the row-active signal;
    a first NAND gate having the row-active signal and an output signal of the first delay means as its inputs; and
    a first inverter for inverting an output signal of the first NAND gate and outputting the row-active interval signal.

4. The semiconductor memory device of claim 3, wherein the edge sensing means includes:
    an inverting/delaying means for inverting/delaying the row-active interval signal;
    a first NOR gate having the row-active interval signal and an output signal of the inverting/delaying means as its inputs; and
    an inverter chain for delaying an output signal of the first NOR gate and outputting the interval end signal.

5. The semiconductor memory device of claim 4, wherein the inverter chain is implemented with second and third inverters which are serially connected.

6. The semiconductor memory device of claim 2, wherein the row-active interval security signal generating means includes:
    an input means for activating its output signal responsive to the row-active signal, and non-activating its output signal responsive to the interval end signal;
    an initialization means for initializing an output node of the input means responsive to a power-up signal;
    a latch means for latching the output signal of the input means; and
    a first inverter for inverting an output signal of the latch means and outputting the row-active interval security signal.

7. The semiconductor memory device of claim 6, wherein the input means includes:
    a second inverter for inverting the row-active signal;
    a PMOS transistor which has an output signal of the second inverter as its gate input, and a source-drain path between a first power supply voltage and its output node; and
    a first NMOS transistor which has the interval end signal as its gate input, and a drain-source path between its output node and a second power supply voltage.

8. The semiconductor memory device of claim 7, wherein the initialization means includes a second NMOS transistor which has the power-up signal as its gate input, and a drain-source path between its output node and the second power supply voltage.

9. The semiconductor memory device of claim 8, wherein the latch means includes third and fourth inverters which are cross-coupled.

10. The semiconductor memory device of claim 2, wherein the column-active interval security signal generating means includes:
    an input means for activating its output signal responsive to the column-active signal, and non-activating its output signal responsive to a burst end signal representing end of a column access operation;
    an initialization means for initializing an output node of the input means responsive to the power-up signal;
    a latch means for latching the output signal of the input means; and
    a first inverter for inverting an output signal of the latch means to output a column-active interval security signal, wherein the security signal includes a column-active interval security signal.

11. The semiconductor memory device of claim 10, wherein the input means includes:
a second inverter for inverting the column-active signal;
a PMOS transistor which has an output signal of the second inverter as its gate input, and a source-drain path between a first supply voltage and its output node; and
a first NMOS transistor which has the burst end signal as its gate input, and a drain-source path between its output node and a second power supply voltage.

12. The semiconductor memory device of claim 11, wherein the initialization means includes:
a second NMOS transistor which has the power-up signal as its gate input, and a drain-source path between its output node and the second power supply voltage.

13. The semiconductor memory device of claim 12, wherein the latch means includes third and fourth inverters which are cross-coupled.

14. The semiconductor memory device of claim 1, wherein the active driving signal generating means includes:
a first NOR gate having the row-active interval security signal and the column-active interval security signal as its inputs;
a first inverter for inverting an output signal of the first NOR gate;
a delay means for delaying an output signal of the first inverter by a predetermined time;
a second NOR gate having output signals of the first inverter and the delay means as its inputs; and
a second inverter for inverting an output signal of the second NOR gate and outputting the active driving signal.

15. A semiconductor memory device comprises:
an active interval security means for generating security signals in response to a row active signal and a column active signal;
an active driving signal generating means for generating an active driving signal in response to the security signals; and
an active driving means for driving an internal voltage in response to the active driving signal,
wherein the security signals is activated during a first predetermined operation period corresponding to the row active signal and a second predetermined operation period corresponding to the column active signal, and
wherein the active interval security means includes:
a row-active interval sensing means for sensing the first predetermined operation period corresponding to the row active signal; and
a column-active interval security signal generating means for sensing the second predetermined operation period corresponding to the column active signal,
wherein the row-active interval sensing means includes:
an interval end signal generating means for generating an interval end signal which represents end of the first predetermined operation period; and
a row-active interval security signal generating means, responsive to the row-active signal and the interval end signal, for generating a row-active interval security signal activated during the first predetermined operation period,
wherein the security signals includes the row-active interval security signal.

16. The semiconductor memory device of claim 15, wherein the interval end signal generating means includes:
a row-active interval signal generating means for activating a row-active interval signal responsive to the activation of the row-active signal, and holding the activation of the row-active interval signal during the first predetermined operation period based on the row-active signal; and
a edge sensing means for sensing the transition of the row-active interval signal to generate the interval end signal.

17. The semiconductor memory device of claim 16, wherein the column-active interval security signal generating means includes:
an input means for activating its output signal responsive to the column-active signal, and non-activating its output signal responsive to a burst end signal representing end of a column access operation;
an initialization means for initializing an output node of the input means responsive to the power-up signal;
a latch means for latching the output signal of the input means; and
a first inverter for inverting an output signal of the latch means to output a column-active interval security signal,
wherein the security signal includes the column-active interval security signal.

* * * * *